United States Patent [19]

Erhart

[11] Patent Number: 5,465,054
[45] Date of Patent: Nov. 7, 1995

[54] HIGH VOLTAGE CMOS LOGIC USING LOW VOLTAGE CMOS PROCESS

[75] Inventor: Richard A. Erhart, Chandler, Ariz.

[73] Assignee: Vivid Semiconductor, Inc., Tempe, Ariz.

[21] Appl. No.: 224,762

[22] Filed: Apr. 8, 1994

[51] Int. Cl.$^6$ ....................................................... H03K 17/10
[52] U.S. Cl. .............................. 326/34; 326/81; 326/121; 326/24
[58] Field of Search ................................. 326/24, 33, 34, 326/81, 83, 121

[56] References Cited

U.S. PATENT DOCUMENTS

| | | | |
|---|---|---|---|
| 4,575,721 | 3/1986 | DelGrange et al. | 340/776 |
| 4,636,784 | 1/1987 | DelGrange et al. | 340/771 |
| 4,689,504 | 8/1987 | Raghunathan et al. | 326/81 |
| 4,704,547 | 11/1987 | Kirsch | 326/121 |
| 4,740,713 | 4/1988 | Sakurai | 307/296.5 |
| 4,955,696 | 9/1990 | Taniguchi et al. | 350/332 |
| 4,956,569 | 9/1990 | Olivio | 307/296.5 |
| 5,057,715 | 10/1991 | Larsen | 326/121 |
| 5,120,991 | 6/1992 | Takahashi | 307/270 |
| 5,170,155 | 12/1992 | Plus et al. | 340/784 |

FOREIGN PATENT DOCUMENTS

| | | | |
|---|---|---|---|
| 563540 | 3/1993 | Japan | 307/448 |

Primary Examiner—Edward P. Westin
Assistant Examiner—Andrew Sanders
Attorney, Agent, or Firm—Cahill, Sutton & Thomas

[57] ABSTRACT

CMOS transistor logic circuitry is permitted to operate at higher power supply voltages while retaining lower voltage processing geometries by inserting input shielding transistors before the gate terminals of each input switching transistor. Each shielding transistor has a gate terminal coupled to a shield voltage of a magnitude substantially midway between ground potential and the positive power supply voltage. The input signal is conveyed by the source-drain channel of the input shielding transistor to the gate of the switching transistor, while preventing the gate of the switching transistor from rising above the shield voltage, in the case of n-channel devices, or below the shield voltage, in the case of p-channel devices. The source-drain channel of a p-channel output shielding transistor couples the output port of p-channel switching transistors to the gate output; the gate terminal of the such p-channel output shielding transistor is coupled to the shield voltage for preventing the drain of p-channel switching transistors from being pulled down below the shield voltage. A similar n-channel output shielding transistor couples the output port of n-channel switching transistors to the gate output for preventing the drain of n-channel switching transistors from being pulled above the shield voltage.

25 Claims, 4 Drawing Sheets

HIGH VOLTAGE CMOS LOGIC USING LOW VOLTAGE CMOS PROCESS

BACKGROUND OF THE INVENTION

1. Field of the Invention

The present invention relates generally to integrated CMOS transistor logic circuits, and more particularly to a form of such logic circuits which permits the use of larger power supply voltages for generating output signals of greater magnitude while retaining high density advantages of low-voltage CMOS processing.

2. Description of the Related Art

CMOS is the most widely used technology for integrated circuits today. The electrical properties of CMOS technology are well understood. The voltage that can be used to power CMOS circuits is dependent upon the physical dimensions of the individual transistors (i.e., their geometry) and the particular processing utilized in the manufacturing of the transistors.

Many CMOS integrated circuits can be operated at power supply ranges of 5 volts or less. Processing techniques have been developed and are known to those skilled in the art for producing highly-dense CMOS integrated circuits which operate over a 5 volt power supply range. These integrated circuits produce output signals which also range approximately between ground and +5 volts.

However, in many cases, the CMOS integrated circuit must drive or control some other device which requires an input signal having a larger voltage magnitude. One example is the need to drive liquid crystal displays (LCD) of the type used in hand-held games, hand-held computers, and laptop/notebook computers. LCD displays used in computer screens require a large number of input control signals which must operate at voltages from 8 volts to as high as 20 volts. If the CMOS integrated circuit is going to be capable of generating an output signal having such an increased voltage magnitude, then the power supply range for such CMOS integrated circuit must also have an increased voltage magnitude.

In general, the higher the power supply voltage needed, the larger the individual transistors must be; in addition, the use of larger power supply voltages necessitates special processing considerations. Larger device geometries and more complex processing generally result in higher manufacturing costs for a particular integrated circuit, since the total area of the integrated circuit, and the complexity of the manufacturing process, are both major factors in determining the cost of a particular circuit.

There are several mechanisms which limit the voltage that a particular CMOS transistor can tolerate. The three most critical mechanisms are:

a) channel breakdown due to excessive voltage appearing between the source and drain terminals of the CMOS transistor.

b) dielectric breakdown of the gate oxide, which is a destructive mechanism. This particular failure mechanism can also be a long term reliability problem because it has been shown that breakdown of the gate oxide is both time dependent and voltage dependent.

c) junction breakdown corresponding to the reverse voltage breakdown of the diode which appears at the source and drain of all CMOS transistors.

With respect to the failure mechanism of junction breakdown, there are actually two types of junctions in a standard CMOS integrated circuit that can breakdown, namely, the source/drain to well junction, and the source/drain to substrate junction. Of these two types of junctions, the source/drain-to-well junction will typically have the lower breakdown voltage and must be considered to be the worst case. Assuming that an n-well process is used, then the lower breakdown voltage is generally in the p channel transistors; conversely, if a p-well process is used, then the lower breakdown voltage occurs in the n channel transistors.

In a typical CMOS logic gate circuit, one or more n-channel devices are coupled between a ground power supply conductor and an output node. In addition, one or more p-channel devices are coupled between the output node and the VDD power supply conductor. When the n-channel transistors are enabled, they create a conductive path from the output node to ground. Alternatively, when the p-channel transistors are enabled, they create a conductive path from the output node to positive supply voltage conductor VDD. Thus, the output node of the logic gate switches between ground and VDD. The gate terminals of the various transistors are coupled to an external input terminal, or alternatively to an output node of a previous logic gate circuit.

In the standard CMOS logic configuration briefly described above, the gate oxide of all the transistors will see a voltage equal to the difference in the power supplies (VDD–GND). In addition, the voltage across the channel, i.e. the voltage between the drain and source, for each of such transistors will also be the difference in the power supplies (VDD–GND). The voltage across the gate oxide, and the voltage across the channel, will not always be at the maximum difference between the power supply voltages, but there is a state of the inputs which can force any of the transistors to see the maximum power supply voltage differential across the gate oxide or across the channel. Accordingly, the power supply voltages for these standard CMOS logic configuration must be chosen to prevent the occurrence of either gate oxide breakdown, impaired reliability of the gate oxide, or channel breakdown.

In addition, the junction diodes formed at the source and drain of each of the CMOS transistors in a standard logic gate will also be exposed to the maximum supply voltage differential as a reverse bias on such junction diodes. Therefore, the magnitude of the voltage of power supply VDD relative to ground cannot exceed the reverse bias junction breakdown of such devices; as indicated above, the worst case normally is observed in the source/drain-to-well junction.

As has been noted above, gate oxide breakdown is partly time-dependent, and the long term reliability of a CMOS integrated circuit is severely affected by the maximum gate oxide voltage applied to the CMOS transistors included therein. Even if the supply voltages are maintained below the theoretical gate oxide breakdown voltage, the long-term reliability of an integrated circuit using such standard CMOS logic configurations can be reduced if the maximum gate oxide voltage is permitted to be too high.

In view of the foregoing, it is an object of the present invention to provide CMOS integrated circuit transistor configurations which can be operated over a power supply range significantly exceeding 5 volts in magnitude (i.e., a higher voltage range) while still using CMOS transistor geometries, and CMOS processing techniques, which are conventionally used for CMOS integrated circuits that operate over a standard 5 volt power supply range.

It is another object of the present invention to provide CMOS integrated logic circuits which permits the use of larger power supply voltages for generating output signals of greater voltage magnitude while retaining high density advantages of low-voltage CMOS processing.

It is still another object of the present invention to provide CMOS integrated circuit transistor configurations which use low-voltage type CMOS transistors in conjunction with higher-voltage power supply ranges while preventing channel breakdown, gate oxide breakdown, and junction breakdown failure modes.

A further object of the present invention is to provide such CMOS integrated circuit transistor configurations which use low-voltage type CMOS transistors in conjunction with higher-voltage power supply ranges without impairing the reliability of such integrated circuits.

A still further object of the present invention is to provide such CMOS integrated circuit transistor configurations which use low-voltage type CMOS transistors in conjunction with higher-voltage power supply ranges without significantly increasing the cost of manufacturing such integrated circuits.

These and other objects of the present invention will become more apparent to those skilled in the art as the description of the present invention proceeds.

SUMMARY OF THE INVENTION

Briefly described, and in accordance with the preferred embodiments thereof, the present invention is a CMOS integrated circuit transistor configuration for allowing operation at relatively higher power supply voltages, while retaining the smaller device geometries of lower voltage CMOS processing, and including a first CMOS logic transistor having source, drain and gate terminals. This first CMOS logic transistor serves as an input shielding transistor, and the gate terminal of this first CMOS logic transistor is coupled to a first shielding voltage conductor adapted to receive a first shielding voltage. The magnitude of this first shielding voltage is selected to lie between the power supply voltages (i.e., ground potential and the positive supply voltage VDD) from which the integrated circuit is operated. The drain terminal of the first CMOS logic transistor is coupled to an input terminal for receiving an input signal; this input signal could be a signal input to the integrated circuit from an external package pin, or alternatively, a signal generated by the output of a prior logic circuit on the same integrated circuit.

The first CMOS logic transistor shields the gate terminal of a second CMOS logic transistor. The gate terminal of the second CMOS logic transistor is coupled to the source terminal of the first CMOS logic transistor. The source terminal of the second CMOS logic transistor is typically coupled to one of the power supply conductors (ground or VDD), either directly or through another CMOS logic transistor. The drain terminal of the second CMOS logic transistor is coupled to a logic gate output terminal, preferably through an output shielding transistor described below, for providing a gate output signal.

The first and second CMOS logic transistors may both be n-channel devices, in which case, the source terminal of the second CMOS logic transistor is coupled to ground potential (directly or through another CMOS logic transistor), and the first CMOS logic transistor prevents the gate of the second CMOS logic transistor from rising above the shield voltage. Alternatively, the first and second CMOS logic transistors may both be p-channel devices, in which case, the source terminal of the second CMOS logic transistor is coupled to positive voltage supply VDD (directly or through another CMOS logic transistor), and the first CMOS logic transistor prevents the gate of the second CMOS logic transistor from falling below the shield voltage.

Assuming that the first and second CMOS logic transistors described above are both n-channel devices, the integrated circuit transistor configuration would also typically include at least third and fourth CMOS logic transistors, each being a p-channel CMOS transistor. Like the first CMOS logic transistor, the third CMOS logic transistor serves as an input shielding transistor for shielding the gate of the fourth CMOS logic transistor. The gate terminal of the third CMOS logic transistor is likewise coupled to a shielding voltage, which may be the same as, or alternatively offset from, the shielding voltage to which the gate of the first CMOS logic transistor is coupled. The drain terminal of the third CMOS logic transistor is also coupled to the input terminal for receiving the input signal, and the source terminal of the third CMOS logic transistor is coupled to the gate terminal of the fourth CMOS logic transistor for conveying the input signal thereto. The source terminal of the fourth CMOS p-channel logic transistor is typically coupled to the opposite one of the power supply conductors (i.e., VDD), either directly or through another p-channel CMOS logic transistor. The drain terminal of the fourth CMOS logic transistor is coupled to a logic gate output terminal, preferably through an output shielding transistor described below, for providing a gate output signal.

The above-described first and second CMOS logic transistors, if again assumed to be n-channel devices, can collectively be regarded as one collective n-channel supertransistor, wherein the gate of the supertransistor is actually the drain of the first CMOS logic transistor, and the source and drain terminals of the supertransistor are coincident with the source and drain terminals of the second CMOS logic transistor. Likewise, the third and fourth CMOS logic transistors, which we have assumed to be p-channel devices, can collectively be regarded as one collective p-channel supertransistor. Two or more n-channel supertransistors can be coupled in series or in parallel, and can be responsive to two or more such input signals, in order to perform various logic functions. Likewise, two or more p-channel supertransistors can be coupled in parallel or in series, and can be responsive to two or more such input signals, to perform such various logic functions.

As suggested above, the CMOS integrated circuit transistor configuration of the present invention preferably includes output shielding transistors for providing an output signal to an output terminal without exposing the CMOS logic transistors to the full voltage range of the output signal. The output shielding transistor circuit includes a first CMOS output transistor having source, drain and gate terminals, the gate terminal of the first CMOS output transistor being coupled to a shielding voltage. Assuming that the first CMOS output transistor is an n-channel device, then the source terminal of the first CMOS output transistor is coupled to the drain terminal of one or more n-channel CMOS supertransistors. The drain terminal of the first CMOS output transistor is coupled to the output terminal, and prevents the drain terminals of the n-channel supertransistors from exposure to a voltage above the shielding voltage.

Likewise, the output shielding transistor circuit includes a second CMOS output transistor having source, drain and gate terminals, the gate terminal of the second CMOS output transistor also being coupled to a shielding voltage. Assuming that the second CMOS output transistor is a p-channel device, then the source terminal of the second CMOS output transistor is coupled to the drain terminal of one or more p-channel CMOS supertransistors. The drain terminal of the second CMOS output transistor is coupled to the output terminal, and prevents the drain terminals of the p-channel supertransistors from exposure to a voltage below the shielding voltage.

Again, the shielding voltage to which the gate of the second CMOS output transistor is coupled could be the same as, or offset from, the shielding voltage to which the gate of the first CMOS output transistor is coupled. Assuming that the output shielding transistors share the same shielding voltage, it is preferably set substantially midway between the first and second power supply voltages received by the first and second power supply conductors.

The integrated circuit transistor configuration summarized above can be formed of conventional CMOS transistors wherein the source and drain regions of each n-channel device are formed in a p-type region (well or substrate) biased to ground potential, and wherein the source and drain regions of each p-channel device are formed in an n-type region (well or substrate) biased to the positive supply voltage VDD. However, in an alternate embodiment fabricated using a so-called n-well CMOS process, the n-type well for each p-channel transistor is shorted to the source terminal of such device for preventing reverse diode breakdown between the source or drain of a p-channel device and the n-type well. A corresponding alternate embodiment designed for a p-well CMOS process shorts the p-type wells for each n-channel transistor to the source terminal of such device for preventing reverse diode breakdown between the source or drain of an n-channel device and the p-type well.

The integrated circuit transistor configuration of the present invention can also be used advantageously to provide transmission gates capable of operation at relatively high power supplies, in addition to the above-summarized logic gates. Like the logic gates already described, the transmission gate configuration includes an input terminal for receiving an input signal; the transmission gate configuration also includes an output terminal for selectively providing an output signal substantially corresponding to the input signal in accordance with a control signal received at a control terminal. As in the case of the logic gate, the transmission gate includes an n-channel supertransistor and a p-channel supertransistor. However, the gate of the n-channel supertransistor is coupled to the control signal while the drain and source of the n-channel supertransistor are coupled, preferably through output shielding transistors, to the input and output terminals, respectively. The gate of the p-channel supertransistor is coupled to the complement of the control signal, while the drain and source of the p-channel supertransistor are again coupled, preferably through output shielding transistors, to the input and output terminals, respectively. A first output shielding transistor couples the drain of the n-channel supertransistor to the input terminal, while a second output shielding transistor couples the source of the n-channel supertransistor to the output terminal. Likewise, a third output shielding transistor couples the drain of the p-channel supertransistor to the input terminal, while a fourth output shielding transistor couples the source of the p-channel supertransistor to the output terminal. Each of the four output shielding transistors includes a gate terminal coupled to a shielding voltage.

DETAILED DESCRIPTION OF THE PREFERRED EMBODIMENTS

Figure 1A:
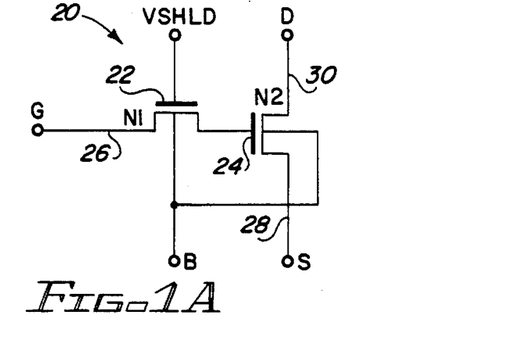
FIG. 1A is a circuit schematic of an n-channel supertransistor formed by two conventional low-voltage CMOS n-channel transistors.

FIG. 1A is a two-transistor circuit schematic of a high voltage n-channel super transistor designated generally by reference numeral 20. Supertransistor 20 includes a first input shielding transistor 22, which is a conventional CMOS n-channel transistor produced using a typical low-voltage (e.g., 5 volt) CMOS process. Supertransistor 20 also includes a second conventional CMOS n-channel transistor 24, which serves as a switching transistor. The drain terminal 26 of input shielding transistor 22 serves as an input to the n-channel supertransistor 20, and is adapted to receive an input switching signal, perhaps corresponding to the output of a prior logic gate on the same integrated circuit. Accordingly, drain terminal 26 of n-channel transistor 22 effectively serves as the gate terminal (G) of the overall n-channel supertransistor 20.

The gate terminal of n-channel transistor 22 is coupled to a conductor biased with a shielding voltage (VSHLD). This shielding voltage will be described in greater detail below, but for the present discussion, it may be assumed that the shielding voltage is approximately midway between ground potential and the positive voltage supply. Thus, if the power supply conductors VDD and GND are at voltages of +10 volts and ground potential, respectively, it may be assumed for the present discussion that VSHLD is biased at approximately +5 volts.

Still referring to FIG. 1, the source terminal of n-channel input shielding transistor 22 is connected to the gate terminal of n-channel switching transistor 24. The source terminal 28 and the drain terminal 30 of switching transistor 24 also correspond to the source (S) and drain (D) terminals of the overall n-channel supertransistor 20.

Figure 1B:
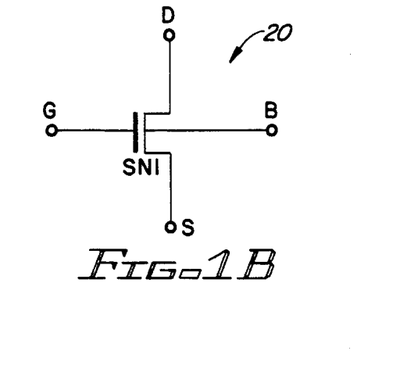
FIG. 1B is a circuit schematic symbol collectively representing the n-channel supertransistor shown in FIG. 1A.

The combination of input shielding transistor 22 and switching transistor 24 form an n-channel supertransistor 20 which can be conceptually viewed as a single transistor having a gate (G), drain (D), source (S), and bulk (B) connection, as illustrated in FIG. 1B. The bulk (B) connection is normally grounded for conventional CMOS processing. The schematic symbol for the supertransistor shown in FIG. 1B looks much like a conventional, single low-voltage CMOS n-channel transistor, except that it includes the designation "SN" for indicating an n-channel supertransistor as configured in FIG. 1A. As will be described below, this basic supertransistor configuration can be used to replace conventional n-channel CMOS transistors in known logic circuits to allow such circuits to operate at double the power supply voltages normally used with such CMOS devices.

Figure 2A:
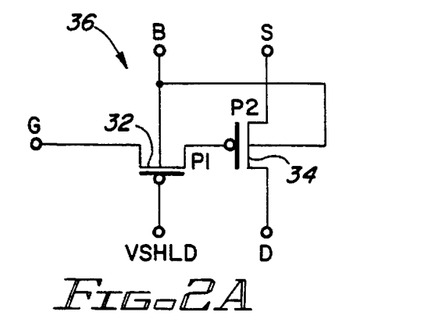
FIG. 2A is a circuit schematic of an P-channel supertransistor formed by two conventional low-voltage CMOS P-channel transistors.

FIG. 2A shows a like transistor configuration but using a pair of conventional low-voltage p-channel CMOS transistors 32 and 34 configured in a similar manner as described in FIG. 1A to form a p-channel supertransistor 36. Once again, the first p-channel device 32 serves as an input shielding transistor, and the second p-channel device 34 serves as a switching transistor. Again, the gate terminal of p-channel input shielding transistor 32 is coupled to a shielding voltage (e.g., VSHLD) that lies between the power supply voltages used to operate the integrated circuit. In many instances, the shielding voltage to which the gate terminal of input shielding transistor 32 is coupled can be the same shielding voltage to which the gate terminal of n-channel input shielding transistor 22 (see FIG. 1A) is connected.

Figure 2B:
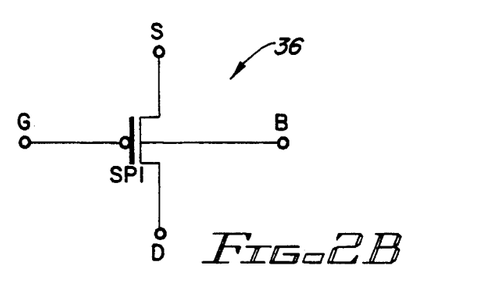
FIG. 2B is a circuit schematic symbol collectively representing the P-channel supertransistor shown in FIG. 1A.

The combination of input shielding transistor 32 and switching transistor 34 form a p-channel supertransistor 36 which can be conceptually viewed as a single transistor having a gate (G), drain (D), source (S), and bulk (B) connection, as illustrated in FIG. 2B. The bulk (B) connection is normally tied to the positive power supply voltage VDD for conventional CMOS processing. The schematic symbol for the supertransistor shown in FIG. 2B looks much like a conventional, single low-voltage CMOS p-channel transistor, except that it includes the designation "SP" for indicating a p-channel supertransistor as configured in FIG. 2A. As will be described below, this basic supertransistor configuration can be used to replace conventional p-channel CMOS transistors in known logic circuits to allow such circuits to operate at double the power supply voltages normally used with such CMOS devices.

The purpose of input shielding transistors 22 and 32 might best be appreciated by referring to a logic gate in which supertransistors 20 and 36 are used. First, however, a conventional CMOS logic inverter gate will be described in relation to FIG. 3. The prior art inverter circuit shown in FIG. 3 includes a single n-channel CMOS transistor 38 and a single p-channel CMOS transistor 40. The gate terminals of transistors 38 and 40 are both tied to input terminal 42 for receiving a logic signal therefrom. For conventional CMOS logic circuits, this input signal switches only between ground and +5 volts. The source terminal of n-channel switching transistor 38 is connected to ground potential (GND) and the source terminal of p-channel switching transistor 40 is connected to the positive power supply VDD. The drain terminals of switching transistors 38 and 40 are commonly coupled to output terminal 44.

Figures 3, 4:
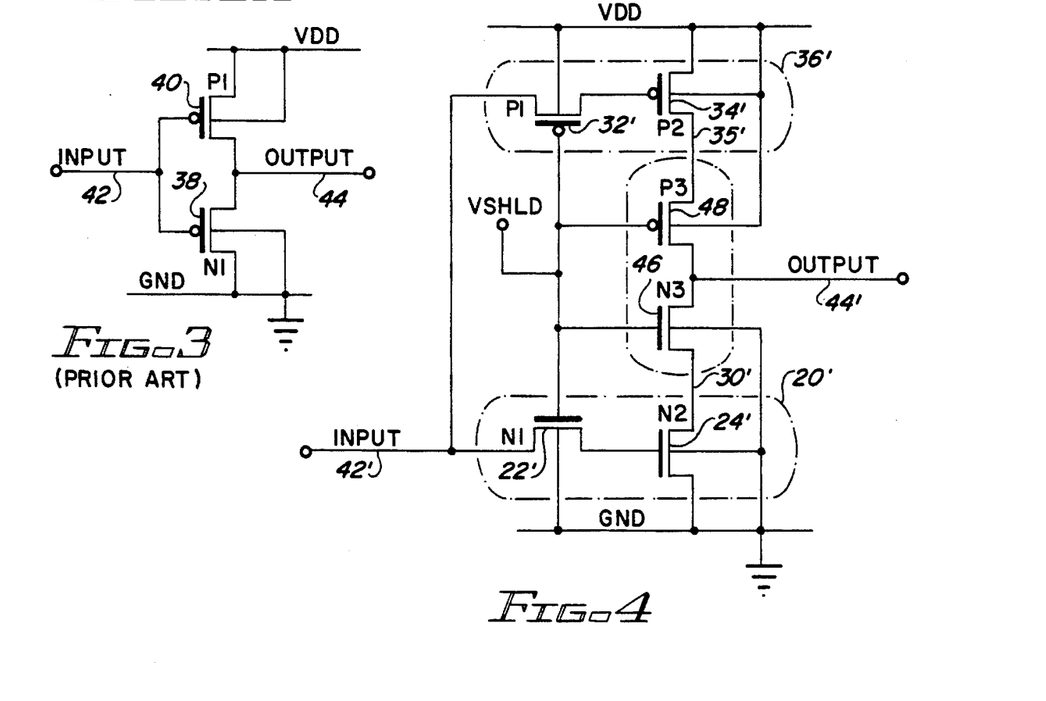
FIG. 3 is a circuit schematic of a conventional, prior art two-transistors CMOS logic inverter circuit.
FIG. 4 is a circuit schematic of a high voltage inverter circuit constructed in accordance with the present invention, wherein an n-channel supertransistor and P-channel supertransistor replace the conventional n-channel and P-channel transistors in a conventional inverter circuit, and wherein output shielding transistors couple the logic output signals to an output terminal.

Still referring to FIG. 3, if the input signal is at +5 Volts (VDD), transistor 38 will conduct, and transistor 40 will be turned off. Accordingly, transistor 38 shorts output terminal 44 to ground potential (GND). In this instance, the maximum voltage across any gate oxide, any source and drain, or any diode junction, is 5 volts. If the input signal switches to GND, transistor 38 will be turned off, transistor 40 will conduct, and output terminal 44 is shorted to VDD; once again, the maximum voltage across any gate oxide, any source and drain, or any diode junction, is 5 volts.

However, if the positive power supply VDD in prior art FIG. 3 were now permitted to raise to +10 volts, and if the input signal received at input terminal 42 is permitted to swing between GND and +10 volts, those skilled in the art will appreciate that the voltages across the gate oxide, between source and drain, and across the junction diodes, would also approach 10 volts, depending upon the status of the input signal. As noted earlier in this specification, this would ordinarily require the use of larger geometry devices and more complex processing.

Turning now to FIG. 4, a high-voltage inverter circuit using the above-described supertransistors is illustrated. Conventional n-channel transistor 38 of FIG. 3 is replaced by supertransistor 20' consisting of input shielding transistor 22' and switching transistor 24'. Likewise, conventional p-channel transistor 40 of FIG. 3 is replaced by supertransistor 36' consisting of input shielding transistor 32' and switching transistor 34'. As described above, the gate terminals of input shielding transistors 22' and 32' are each coupled to a shielding voltage VSHLD. In this example, it will be assumed that VDD is +10 volts, and that the shielding voltage VSHLD is midway between VDD and GND, or +5 Volts. It will also be assumed that the input signal supplied to input terminal 42' ranges between GND and +10 Volts.

The purpose of input shielding transistor 22' in FIG. 4 is to limit the gate voltage seen by switching transistor 24'. When the input terminal 42' is at 0 volts, input shielding transistor 22' will be fully conductive and will pass 0 volts to the gate of switching transistor 24', which will turn it off as needed. However, if the input signal at input terminal 42' transitions to +10 volts, input shielding transistor 22' will pull the gate terminal of switching transistor 24' "high", but only to a value of VSHLD minus Vtn (where Vtn is the n-channel threshold voltage); this voltage is just below +5 volts and is sufficiently high to render switching transistor 24' fully conductive and to short GND to the source terminal of switching transistor 24'. Nonetheless, because input shielding transistor 22' is not fully conductive under such circumstances, it blocks the +10 volts presented at input terminal 42' from reaching the gate terminal of switching transistor 24'. This effectively limits the maximum gate voltage of switching transistor 24', thereby preventing gate oxide breakdown and possible reliability problems associated with elevated gate voltages. It should be noted that it is not the absolute value of the gate voltage that causes problems, but the difference in voltage between the gate and either the source or drain. The oxide breakdown is caused by having too large of a voltage potential across the gate oxide.

As its name implies, input shielding transistor 22'

"shields" the gate of switching transistor 24' from excessive gate voltages which might otherwise impair the reliability of switching transistor 24'. In addition, the voltage across the gate oxide of input shielding transistor 22' is also limited, in this case to a maximum of 5 volts with respect to either the source or drain, due to the value of the shielding voltage VSHLD. No matter whether the input terminal voltage is GND or +10 volts, the voltage differential between the gate terminal (which is at +5 volts) and the drain terminal (which can swing between GND and +10 volts) is never more than 5 volts.

Still referring to FIG. 4, input shielding transistor 32' performs an analogous function with respect to shielding the gate terminal of switching transistor 34'. If input terminal 42' is "high" at +10 volts, then input shielding transistor 32' is rendered conductive, shorting the +10 volt input voltage to the gate terminal of switching transistor 34'. This gate voltage renders switching transistor 34' non-conductive. However, if the input signal at input terminal 42' transitions to GND, input shielding transistor 32' will pull the gate terminal of switching transistor 34' "low", but only to a value of VSHLD plus Vtp (where Vtp is the p-channel threshold voltage); this voltage is just above +5 volts and is sufficiently low to render switching transistor 34' fully conductive and to short VDD to the drain terminal of switching transistor 34'. Nonetheless, because input shielding transistor 32' is not fully conductive under such circumstances, it blocks the 0 volts presented at input terminal 42' from reaching the gate terminal of switching transistor 34'. This effectively limits the minimum gate voltage of switching transistor 24', thereby preventing gate oxide breakdown and possible reliability problems associated with elevated gate oxide voltages.

Within FIG. 4, there are two additional output shielding transistors 46 and 48 which have yet to be described. Output shielding transistors 46 and 48 are needed to protect the transistors near the output of any high voltage logic device, such as switching transistors 24' and 34' of FIG. 4. The gate terminals of output shield transistors 46 and 48 are each coupled to the shield voltage (VSHLD). The drain terminals of output shield transistors 46 and 48 are each coupled to the output terminal 44'. It will be recalled that the output signal generated at output terminal 44' is to switch fully between the power supply levels of GND and VDD. Assuming that the shield voltage (VSHLD) is set at half of the power supply voltage of the circuit [ (VDD–GND)/2], or + 5 volts in the present example, then the gate oxide of output shielding transistors 46 and 48 will never see more than half the power supply voltage (i.e., no more than 5 volts), regardless of the voltage on the output terminal 44'.

As their names imply, output shielding transistors 46 and 48 shield the logic switching transistors to which they are connected from excessive voltages. The shield voltage prevents the drain terminal 30' of n-channel switching transistor 24' from having a voltage higher than VSHLD–Vtn, just less than +5 volts, even if the output terminal 44' is at +10 volts. Likewise, the shield voltage also prevents the drain terminal 35' of p-channel switching transistor 34' from having a voltage lower than VSHLD+Vtp, just above +5 volts, even if the output terminal 44' is at 0 volts. The value of Vtn and Vtp are assumed to be positive. Typical ranges for Vtn in a standard n-well CMOS process would range from 0.5 to 1.0 volts, and Vtp would range from 0.6 to 1.1 volts. These output shielding transistors 46 and 48 effectively protect the n and p channel logic sections from gate oxide and channel breakdown possibilities.

With the above-described example of FIG. 4 in mind, those skilled in the art will appreciate that supertransistors 20 and 36 of FIGS. 1B and 2B, together with a pair of output shielding transistors, may be used to construct a variety of standard CMOS logic gate configurations for operation at higher voltages. Note that the n-channel supertransistor 20 can appear as a normal n-channel transistor within a circuit schematic and can be connected as such in a CMOS logic configuration. The shield voltage connection is not shown and is inherent in the design of the cell, much as the power supply connections are not shown for a standard CMOS logic gate. Likewise, the p-channel supertransistor 36 can appear as a normal p-channel transistor within a circuit schematic and can be connected as such in a CMOS logic configuration.

It is realized that the circuit of FIG. 4 uses many more transistors than the conventional CMOS inverter circuit shown in FIG. 3. However, the high voltage supertransistor configuration of the present invention can roughly halve the device geometry that would otherwise be needed to accommodate such higher operating voltages. Because the area of a CMOS circuit is proportional to the square of the basic dimensions, if the geometry can be halved, then the resulting area is one fourth of the original. CMOS geometries are typically expressed as the minimum length of the transistor gate which can be fabricated. All other critical dimensions are proportional to the length of the gate in some fashion. Thus, four times as many transistors can be used without increasing the device area on the integrated circuit. In comparing FIG. 4 to FIG. 3, we see that six transistors were required instead of two. However, even if the number of transistors were increased by a factor of 3, the resulting area required on the integrated circuit would still be less. More complicated logic circuits increase the number of total transistors by less than a factor of three.

As an example of the usefulness of this invention, suppose that a 2.0 micron process is needed to support an operating voltage of 10 volts. Using the present invention, the same circuit could be achieved using a 1.0 micron process. If the exact same number of transistors are utilized to fabricate the circuit in both cases, the resulting area with the new invention would be roughly one fourth of the original. In reality, the invention imposes some additional transistors on the circuit, roughly doubling the total number, therefore the resulting area is roughly one half of the original. This still achieves a major impact on reducing the cost of the circuit, since the cost of an integrated circuit is roughly proportional to the total area of the circuit. In fact, the actual relationship between the area of an integrated circuit and the resulting cost is a nonlinear equation. If the area of an integrated circuit is halved, the resulting cost is less than half. The exact value depends upon the sizes of the integrated circuit and the yield equation for the particular process being used.

Still referring to FIG. 4, those skilled in the art will appreciate that there will be instances wherein the source-to-drain channel voltage may exceed 5 volts. For example, if input terminal 42' is at +10 volts, the voltage at the gate terminal of switching transistor 24' will be below +5 volts, perhaps as low as +4 volts, depending upon the n-channel threshold voltage. This means that the voltage across the drain and source terminals of input shielding transistor 22' may be as much as 6 volts. This is only slightly worse than the channel voltage that a standard logic configuration would see at 5.0 volt supplies. It should also be noted that channel breakdown is not a destructive mechanism. In the case of this circuit, if channel breakdown was achieved at 5.5 volts, then the devices would merely conduct additional current across the channel until the channel voltage dropped below the 5.5 volt condition. If channel breakdown occurs at 5.5 volts, then input shielding transistor 22' would continue to conduct current until the gate terminal of switching transistor 24' rose to 4.5 volts, leaving 5.5 volts across the channel. While it is not a desirable situation to allow devices to operate in channel breakdown mode, this example illustrates that no destructive circuit conditions exist even in that case.

Figure 5:
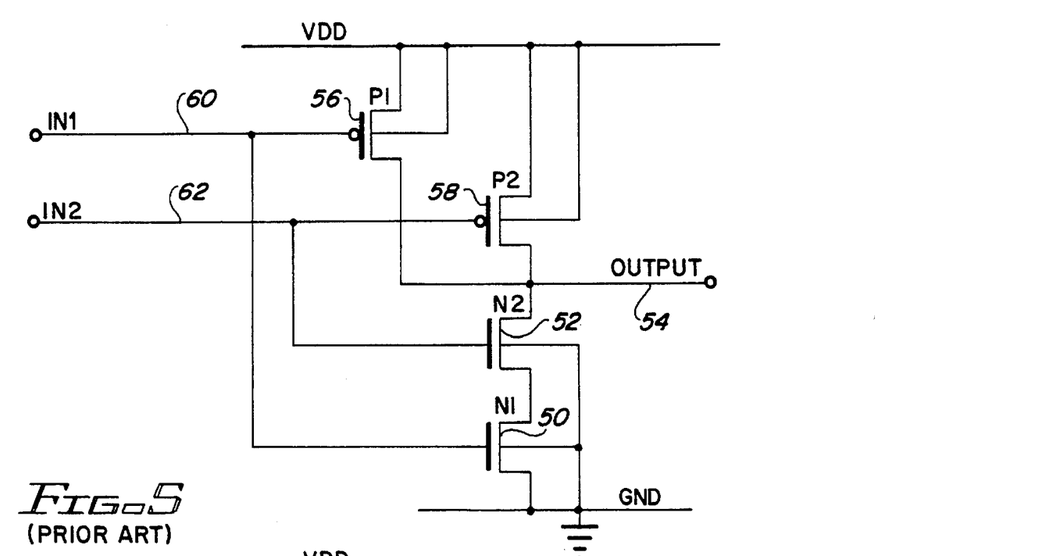
FIG. 5 is a circuit schematic of a conventional low-voltage two-input CMOS NAND gate.

Turning now to FIG. 5, a conventional (prior art) CMOS two-input NAND logic gate is shown. A pair of n-channel switching transistors 50 and 52 are coupled in series between GND and output terminal 54. A pair of p-channel switching transistors 56 and 58 are coupled in parallel between VDD and output terminal 54. A first input terminal 60 is coupled to the gate terminals of transistors 50 and 56, while a second input terminal 62 is coupled to the gate terminals of transistors 52 and 58. If either input signal is low, the output signal will be high. Only if both input signals are high (VDD), will the output be low (GND).

Figure 6:
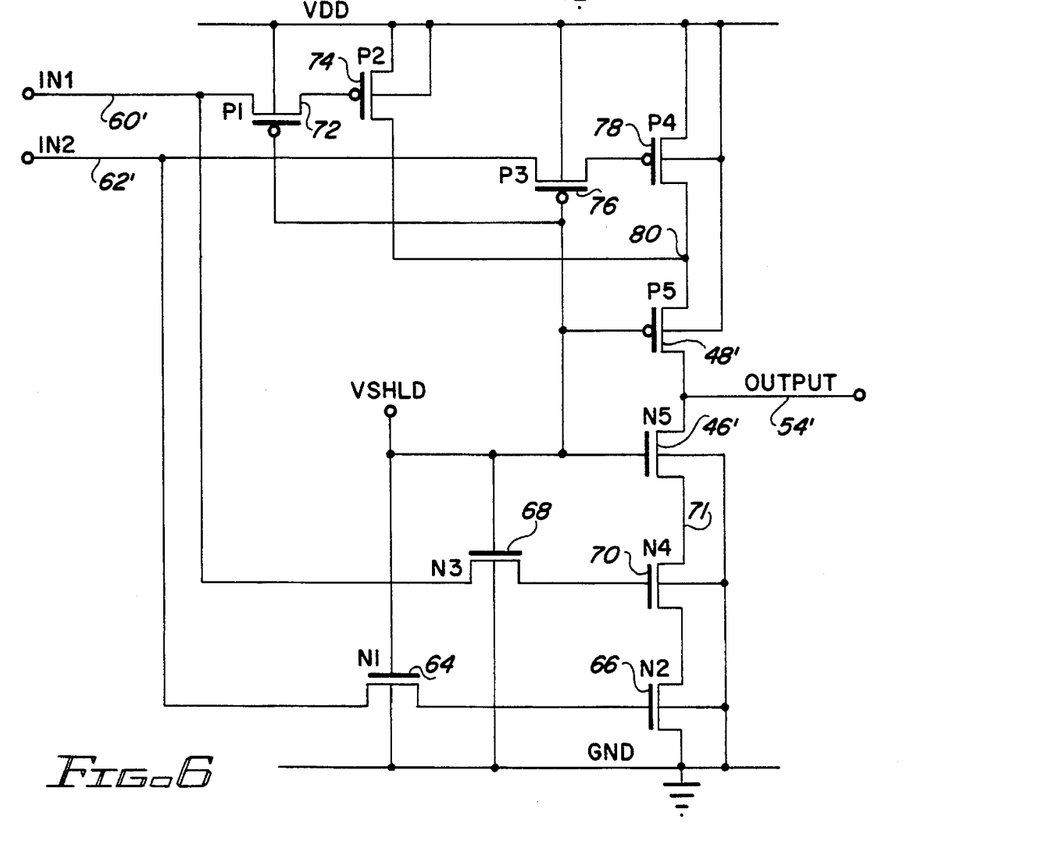
FIG. 6 is a circuit schematic of a high voltage two-input, two-input CMOS NAND gate constructed in accordance with the present invention.

FIG. 6 shows the equivalent two-input NAND gate for high voltage operation using the supertransistors and output shielding transistors of the present invention. The n-channel switching transistor 50 of FIG. 5 is replaced by the n-channel supertransistor formed by n-channel devices 64 and 66. Similarly, the second n-channel switching transistor 52 of FIG. 5 is replaced by the n-channel supertransistor formed by n-channel devices 68 and 70. The supertransistor 64/66 is coupled in series with supertransistor 68/70 between GND and an n-channel logic node 71 formed at the drain of transistor 70; this n-channel logic node is coupled to output terminal 54' by output shielding transistor 46'.

In similar fashion, the p-channel transistors 56 and 58 of FIG. 5 are replaced by p-channel supertransistors 72/74 and 76/78, respectively. These p-channel supertransistors are coupled in parallel with each other between VDD and a p-channel logic node 80. P-channel logic node 80 is, in turn, coupled to output terminal 54' via output shielding transistor 48'. While the overall number of transistors increases from 4 to 10, the net increase in device area is far less than if the circuit of FIG. 5 were constructed of devices having double the gate length in order to tolerate the higher voltage.

The logical operation of the circuit configuration shown in FIG. 6 is identical to the logical operation of the standard CMOS 2-input "NAND" gate circuit shown in FIG. 5. Using the same assumptions made with respect to the circuit of FIG. 4, it will be appreciated that none of the devices see a gate oxide voltage over 5.0 volts when using 10 volt supplies, and that the channel voltage is also restricted to 6.0 volts as before. It should be apparent that the combination of the output transistors and the super transistors restrict the gate voltages and the channel voltages of all of the devices of the circuit. The unique use of the extra transistors tied to a shield voltage serves to protect all of the devices from the full swing of the power supplies.

As indicated earlier, the penalty for using high voltage logic configurations constructed in accordance with the present invention is to double the number of transistors used in the standard logic circuit (for replacement by super transistors) and to add two transistors per logic gate as output shielding transistors. The total penalty in terms of number of transistors is therefore over twice the original circuit. As mentioned earlier, if the geometry can be halved, then the area of each transistor is roughly one fourth of the original.

In actual practice, the area consumed by the logic gates is less than the total area of the integrated circuit. The interconnection area between the various logic gates can, in many integrated circuits, exceed the area consumed by the logic gates themselves. The high voltage circuits described and illustrated herein add no additional interconnect between the logic gates, so the area required for interconnections over and above that required for the logic gates would be reduced. The only additional interconnection required with the high voltage gates described herein is the connection of the shield voltage VSHLD, which can be treated as a global power supply and routed through the gate cells, as is commonly done with the VDD and GND supplies currently. It should be noted that the shield voltage attaches only to the gates of the logic devices and therefore consumes near zero DC current. It is not truly a power supply but can be treated as such for ease of internal connection in the high voltage logic gates.

Within FIG. 6, supertransistors 64/66 and 68/70 are coupled in series, while supertransistors 72/74 and 76/78 are coupled in parallel. Those skilled in the art will appreciate that the logic gate of FIG. 6 could easily be converted to a three-input NAND gate simply by adding a further n-channel supertransistor in series with supertransistors 64/66 and 68/70, and by adding a further p-channel supertransistor in parallel with supertransistors 72/74 and 76/78. Likewise, those skilled in the art will appreciate that the two-input NAND gate of FIG. 6 could easily be converted into a two-input NOR gate merely by putting supertransistors 64/66 and 68/70 in parallel with each other, and by putting supertransistors 72/74 and 76/78 in series with each other.

Figures 7, 8, 9:
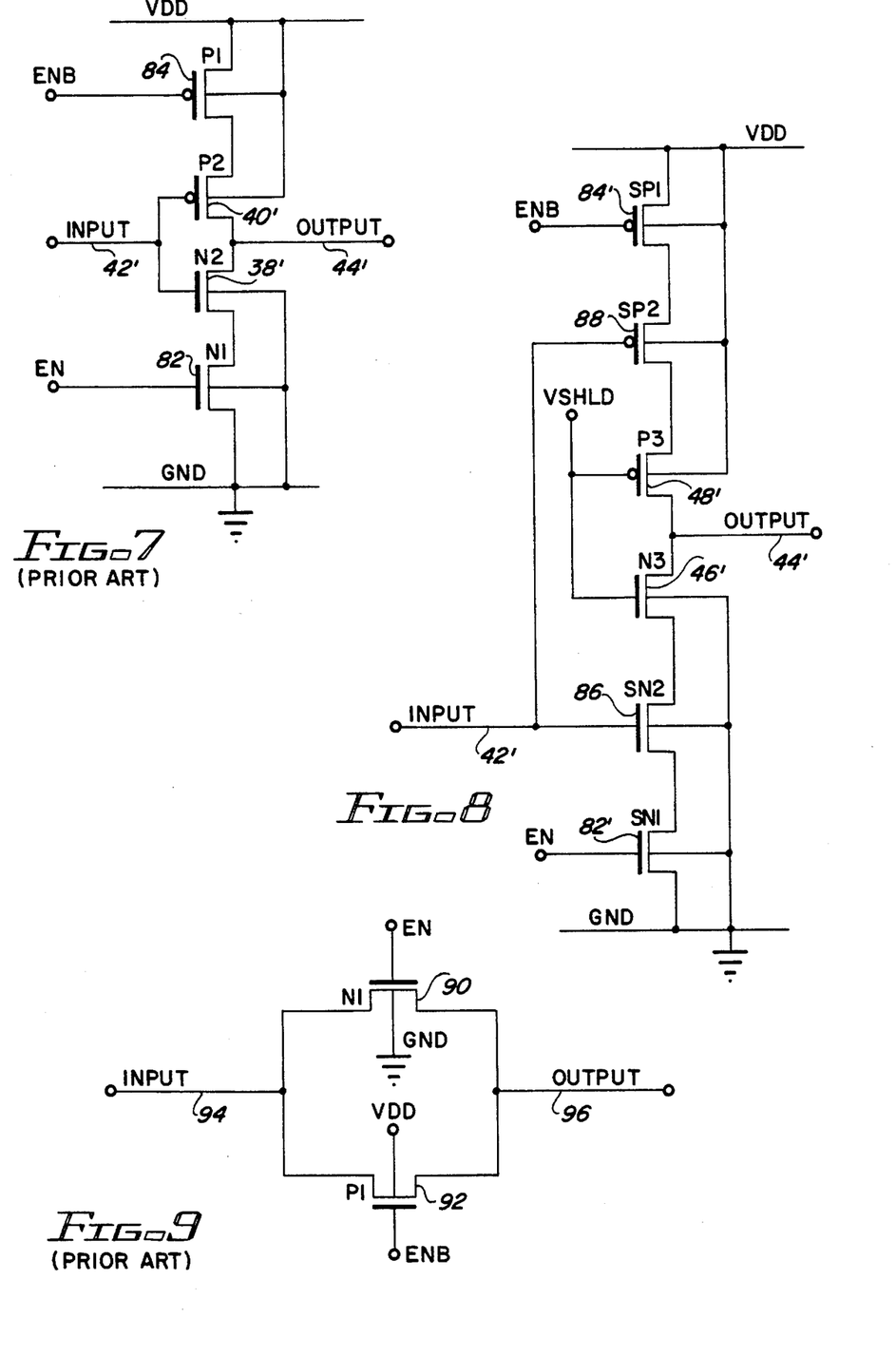
FIG. 7 is a circuit schematic of a prior art, conventional CMOS tri-state inverter gate transistor configuration.
FIG. 8 is a circuit schematic of a high-voltage CMOS tri-state inverter gate transistor configuration constructed in accordance with the present invention.
FIG. 9 is a circuit schematic of a prior art, conventional CMOS low-voltage transmission gate.

Referring now to FIG. 7, a conventional CMOS tri-state inverter circuit is shown. Like the inverter circuit of FIG. 3, the tri-state inverter circuit includes an n-channel switching transistor 38' and a p-channel switching transistor 40', both of which have their gate terminals coupled to input terminal 42'. As in FIG. 3, the drain terminals of switching transistors 38' and 40' are commonly coupled to the output terminal 44'. However, the source terminal of transistor 38' is coupled to GND through n-channel enabling transistor 82. Similarly, the source terminal of transistor 40' is coupled to VDD through p-channel enabling transistor 84. The output of the tri-state inverter has three output conditions, namely, high (VDD), low (GND), and a high impedance. The high impedance condition is created by forcing input control signal EN to GND, and by forcing its complement ENB to VDD; in this mode, neither enabling transistor 82 nor enabling transistor 84 can conduct, and output terminal 44' simply floats as a high impedance.

FIG. 8 is a circuit schematic of a high voltage tri-state inverter constructed using supertransistors in accordance with the present invention. In the schematic of FIG. 8, enabling transistors 82 and 84 of FIG. 7 are replaced with supertransistors 82' and 84', respectively; switching transistors 38' and 40' of FIG. 7 are replaced by supertransistors 86 and 88, respectively. Finally, output shielding transistors 46' and 48' are inserted between switching supertransistors 86 and 88 and output terminal 44', respectively.

One very common CMOS circuit element that has not yet been mentioned is the CMOS transmission gate. FIG. 9 shows the circuit configuration common to all standard CMOS transmission gates. The gate terminal of n-channel transistor 90 is coupled to an enable control signal EN, while the gate terminal of p-channel transistor 92 is coupled to the complementary enable control signal ENB. When EN is high (and ENB is low), transistors 90 and 92 can couple any voltage presented at input terminal 94 to output terminal 96 (and vice versa). When EN is low (and ENB is high), transistors 90 and 92 are disabled, and output terminal 96 is isolated from input terminal 94.

The transmission gate of FIG. 9 is unique compared to other logic elements because it is bi-directional in nature. Although there is an "INPUT" and "OUTPUT" node shown, the device can conduct current or pass voltages in either direction. In addition, this device is capable of passing any voltage within the bounds of the power supplies used to generate the control signals EN and ENB. In other words, unlike the previous logic gates which output a digital "high" or "low" state (VDD or GND in the examples), this device can pass an analog voltage. These two properties make the construction of a high voltage CMOS transmission gate very difficult and the circuit penalty in terms of additional transistors is larger than for any of the previously described logic gates.

Figures 10, 11A, 11B, 12:
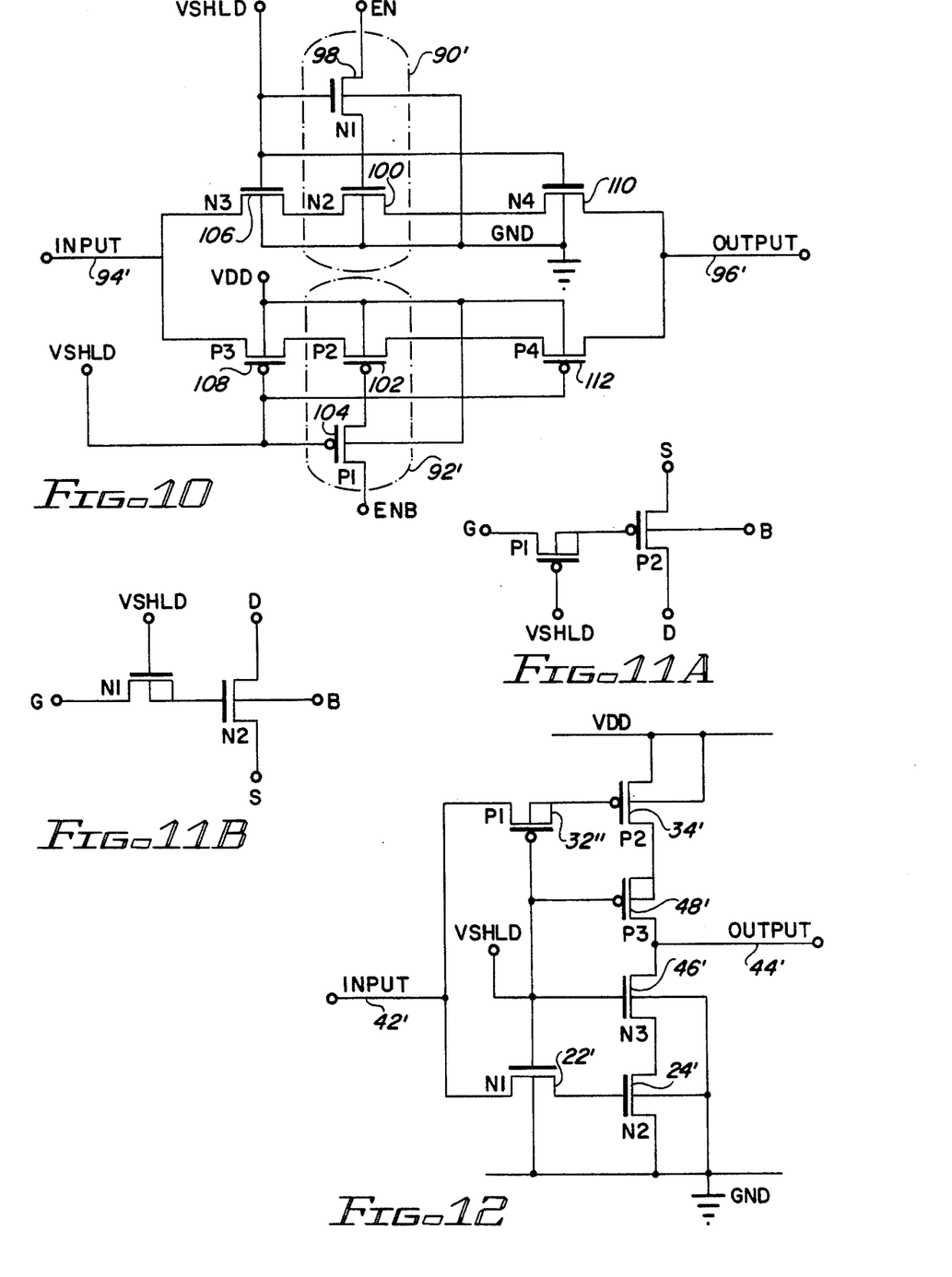
FIG. 10 is a circuit schematic of a high-voltage CMOS transmission gate constructed in accordance with the present invention.
FIG. 11A illustrates an alternate embodiment of the P-channel of the supertransistor configuration shown in FIG. 2A for an n-well process.
FIG. 11B illustrates an alternate embodiment of the n-channel of the supertransistor configuration shown in FIG. 1A for an P-well process.
FIG. 12 is a circuit schematic of a high-voltage CMOS inverter transistor configuration similar to that described in conjunction with FIG. 4 but using the modified P-channel supertransistor shown in FIG. 11A.

FIG. 10 shows the circuit configuration for a high voltage CMOS transmission gate. Transistors 98 and 100 form an n-channel supertransistor 90' that replaces transistor 90 of FIG. 9. Transistors 102 and 104 form a p-channel supertransistor 92' that replaces transistor 92 of FIG. 9. Thus far, the description of the transistor replacement is identical to that performed for all the other logic gates previously described. The next step is the addition of the output shielding transistors which must be placed between the logic transistors and the output node. Here, however, one must contend with the bi-directional nature of this gate and realize that both the INPUT and OUTPUT nodes must be viewed as outputs. Therefore, two sets of output shielding transistors are required. Thus, a first n-channel output shielding transistor 106 is inserted between input terminal 94' and supertransistor 90', and a first p-channel output shielding transistor 108 is inserted between input terminal 94' and supertransistor 92'. Next, a second n-channel output shielding transistor 110 is inserted between output terminal 96' and supertransistor 90', and a second p-channel output shielding transistor 112 is inserted between output terminal 96' and supertransistor 92'. Viewing the circuit with this in mind, one can see that the method for altering a standard circuit to become a high voltage circuit is still the same. This particular circuit must simply be recognized as being bi-directional, however.

The resulting high voltage CMOS transmission gate has two major drawbacks. First, the transistor penalty is four times that of the original circuit, effectively negating the area savings advantage for this particular gate. Second, if the shield voltage VSHLD is set at the midpoint of the supply range, in the manner described thus far, this circuit is incapable of acting as a full-range analog transmission gate. The reduced gate voltages on transistors 100 and 102 will create a "dead band" near the center of the operating supplies, and the transmission gate will therefore be unable to accurately pass the input voltage. Thus, the transmission gate shown in FIG. 10 can replace CMOS transmission gates used in digital circuitry, but has some limitations when used as an analog transmission gate.

One way to resolve the problem of a dead band is to use separate shield voltages (VSHLD1 and VSHLD2) for the n-channel and p-channel devices. These shield voltages could be chosen so that the dead band does not exist. If it is again assumed that VDD is +10 volts, and that the gate-to-channel thresholds are approximately 1 volt, then the n-channel shield voltage VSHLD1 could be set at slightly over 6 volts, and the p-channel shield voltage VSHLD2 could be set at slightly under 4 volts. Using such shield voltages, the deadband would be eliminated; however, some of the devices would see 6 volts on the gate oxide instead of 5 volts. This would also improve the speed of the device due to the added gate voltage but would cause slightly lower reliability due to the same reason (increased gate oxide voltages). The same method could be applied to all of the previously shown logic gates for improving the speed, but at a slight penalty in gate oxide voltage reliability.

One limitation upon the use of the above-described high voltage logic circuits relates to the junction breakdown which, as a practical matter, may determine the ultimate maximum voltage at which the circuit can be operated. This breakdown mechanism is the reverse voltage breakdown of the diode formed at the source and drain of all CMOS devices. Typically, the junctions of the transistor which are fabricated in the "well" (n-well or p-well) will have the lowest junction breakdown voltage. The high voltage logic configurations mentioned thus far will not improve upon this breakdown, and will thus be limited by this mechanism to an operating voltage which will prevent junction breakdown. An alternate configuration is described below which will increase the operating voltage to the limit of the junction breakdown for devices formed outside of the "well".

As set forth above, the limiting operating voltage for the invention may be determined by the junction breakdown of the transistor fabricated in the well. Assuming that an n-well CMOS process is being used, the p+ to n-well junction (i.e., the p-channel source and drain diodes) would then be the limiting case for junction breakdown for all of the configurations shown thus far. An alternate configuration is described below in conjunction with FIGS. 11A and 12 which will extend the operating voltage to the limit of the junction breakdown of the n+ to p-junction (n-channel source and drain diodes), a value which is typically higher by several volts. Those skilled in the art will be able to ascertain the corresponding transistor configurations needed for use on a p-well process.

FIG. 12 shows an alternate high voltage inverter configuration with only two slight differences from the previous high voltage inverter configuration of FIG. 4. The well (or Bulk) connections for p-channel input shielding transistor 32" and output shielding transistor 48' are not connected to VDD as before in FIG. 4. Instead, the well of input shielding transistor 32" is shorted to the source terminal thereof, and the well of output shielding transistor 48' is also connected to its source terminal. The modified form of p-channel supertransistor formed by transistors 32" and 34' is indicated in FIG. 11A. These connections protect the junction diodes from breakdown, because the reverse voltage on the diode junction is never higher than a threshold voltage above the VSHLD voltage. A closer look at this configuration will confirm that none of the p channel sources or drains see the entire supply voltage across their junctions. The use of VSHLD at a value of (VDD–GND)/2 will ensure that the p+ to n-well diode junctions are exposed to voltages only a threshold voltage higher than the shield voltage. Thus, if VDD is +10 volts, and the p channel threshold voltage is 1.0 volt, then the maximum sustained voltage on any p+ to n-well junction is roughly 6 volts. Using this configuration, the operating voltage may be increased to the junction breakdown of the n-channel sources and drains.

The extrapolation of this configuration to all of the other logic gates is straightforward. Each of the p-channel supertransistors would have the well connection of the input shielding transistor connected to the gate terminal of its paired switching transistor. In addition, the p-channel output shielding transistor in the output stage would have its well connected to its source. For an n-well process, there would be no changes in the n-channel super transistor configuration, nor would there be any changes to the n-channel output shielding transistor. FIG. 11B shows the alternate n-channel supertransistor configuration that could be utilized to increase the operating voltage on a p-well process. For a p-well process, the n-channel output shielding transistor would have its well connected to its source, but there would be no changes in the p-channel supertransistor configuration nor any changes in the p-channel output shielding transistor.

Those skilled in the art will understand how these two changes could be made to create all of the basic logic gates for either an n-well or p-well process. The first change involves using the alternate supertransistor configuration of FIG. 11A or 11B, depending on whether it is an n-well or p-well process, respectively. The second change is in the output shielding transistors and involves the connection of the well of the output transistor to the source of the output transistor. If an n-well process is used, then the p-channel output shielding transistor would have its well tied to its source. If a p-well process is used, then the n-channel output shielding transistor would have its well tied to its source.

While only a small number of high voltage logic gates have been described herein in accordance with the teachings of the present invention, those skilled in the art will appreciate that a wide variety of logic building blocks, such as gates, flip-flops, registers, shift registers, adders, and other logic elements currently made from CMOS logic gates may also be made from the high voltage logic gate transistor configurations described herein. It will be appreciated that the present invention extends to all standard CMOS logic configurations. The individual transistors of a CMOS logic gate are simply replaced with the corresponding type supertransistors, and the high voltage output shielding transistors are inserted between the logic nodes and the output terminal. The alternate configuration can be supported easily for all CMOS logic gates and simply involves changes in the connections of the wells for the supertransistors and the output shielding devices.

While the present invention has been described with respect to several preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

I claim:

1. A CMOS integrated circuit transistor configuration for allowing operation at relatively higher power supply voltages, comprising in combination:
   a. first and second power supply conductors adapted to receive first and second power supply voltages, the magnitude of the difference between the first and second power supply voltages corresponding to a predetermined operating voltage;
   b. a first shielding voltage conductor adapted to receive a first shielding voltage, the first shielding voltage being approximately midway between the first and second power supply voltages;
   c. an input terminal for receiving an input signal;
   d. a first CMOS transistor having source, drain and gate terminals, the drain terminal of said first CMOS transistor being coupled to said input terminal, and the gate terminal of said first CMOS transistor being coupled to said first shielding voltage conductor;
   e. a second CMOS transistor having source, drain and gate terminals, said second CMOS transistor operating reliably only when the voltage applied across its gate and source terminals is less than said predetermined operating voltage, the gate terminal of said second CMOS transistor being coupled to the source terminal of said first CMOS transistor, the source terminal of said second CMOS transistor being coupled to one of said first and second power supply conductors; and
   f. an output terminal for providing an output signal, said output terminal being coupled to the drain terminal of said second CMOS transistor.

2. The CMOS integrated circuit transistor configuration as recited by claim 1 wherein said first and second CMOS transistors are each n-channel CMOS transistors.

3. The CMOS integrated circuit transistor configuration as recited by claim 2 wherein one of the first and second power supply voltages is ground potential, and wherein the source terminal of said second transistor is coupled to ground potential.

4. The CMOS integrated circuit transistor configuration as recited by claim 1 wherein said first and second CMOS transistors are each p-channel CMOS transistors.

5. The CMOS integrated circuit transistor configuration as recited by claim 4 wherein one of the first and second power supply voltages is a positive supply voltage above ground potential, and wherein the source terminal of said second CMOS transistor is coupled to the positive supply voltage.

6. The CMOS integrated circuit transistor configuration as recited by claim 2 and further including:
   a. a third CMOS transistor being a p-channel CMOS transistor and having source, drain and gate terminals, the drain terminal of said third CMOS transistor being coupled to said input terminal, and the gate terminal of said third CMOS transistor being coupled to said first shielding voltage conductor; and
   b. a fourth CMOS transistor being a p-channel CMOS transistor and having source, drain and gate terminals, the gate terminal of said fourth CMOS transistor being coupled to the source terminal of said third CMOS transistor, the source terminal of said fourth CMOS transistor being coupled to one of said first and second power supply conductors, and the drain terminal of said fourth CMOS transistor being coupled to said output terminal.

7. The CMOS integrated circuit transistor configuration as recited by claim 2 and further including:
   a. a second shielding voltage conductor adapted to receive a second shielding voltage, the second shielding voltage being approximately midway between the first and second power supply voltages;
   b. a third CMOS transistor being a p-channel CMOS transistor and having source, drain and gate terminals, the drain terminal of said third CMOS transistor being coupled to said input terminal, and the gate terminal of said third CMOS transistor being coupled to said second shielding voltage conductor; and
   c. a fourth CMOS transistor being a p-channel CMOS transistor and having source, drain and gate terminals, the gate terminal of said fourth CMOS transistor being coupled to the source terminal of said third CMOS transistor, the source terminal of said fourth CMOS transistor being coupled to one of said first and second power supply conductors, and the drain terminal of said fourth CMOS transistor being coupled to said output terminal.

8. The CMOS integrated circuit transistor configuration as recited by claim 1 and further including:
   a. a second input terminal for receiving a second input signal;

b. a third CMOS transistor having source, drain and gate terminals, the drain terminal of said third CMOS transistor being coupled to said second input terminal, and the gate terminal of said third CMOS transistor being coupled to said first shielding voltage conductor; and c. a fourth CMOS transistor having source, drain and gate terminals, the gate terminal of said fourth CMOS transistor being coupled to the source terminal of said third CMOS transistor, the source terminal of said fourth CMOS transistor being coupled in common with the source terminal of said second CMOS transistor to one of said first and second power supply conductors, and the drain terminal of said fourth CMOS transistor being coupled to said output terminal.

9. The CMOS integrated circuit transistor configuration as recited by claim 8 wherein said first, second, third, and fourth CMOS transistors are each n-channel CMOS transistors.

10. The CMOS integrated circuit transistor configuration as recited by claim 8 wherein said first, second, third, and fourth CMOS transistors are each p-channel CMOS transistors.

11. The CMOS integrated circuit transistor configuration as recited by claim 1 and further including:

a. a second input terminal for receiving a second input signal;

b. a third CMOS transistor having source, drain and gate terminals, the drain terminal of said third CMOS transistor being coupled to said second input terminal, and the gate terminal of said third CMOS transistor being coupled to said first shielding voltage conductor; and c. a fourth CMOS transistor having source, drain and gate terminals, the gate terminal of said fourth CMOS transistor being coupled to the source terminal of said third CMOS transistor, the source terminal of said fourth CMOS transistor being coupled to the drain terminal of said second CMOS transistor, and the drain terminal of said fourth CMOS transistor being coupled to said output terminal, said fourth CMOS transistor serving to selectively couple the drain terminal of said second CMOS transistor to said output terminal.

12. The CMOS integrated circuit transistor configuration as recited by claim 11 wherein said first, second, third, and fourth CMOS transistors are each n-channel CMOS transistors.

13. The CMOS integrated circuit transistor configuration as recited by claim 11 wherein said first, second, third, and fourth CMOS transistors are each p-channel CMOS transistors.

14. The CMOS integrated circuit transistor configuration as recited by claim 1 further including a third CMOS transistor having source, drain and gate terminals, the gate terminal of said third CMOS transistor being coupled to said first shielding voltage conductor, the source terminal of said third CMOS transistor being coupled to the drain terminal of said second CMOS transistor, and the drain terminal of said third CMOS transistor being coupled to said output terminal.

15. The CMOS integrated circuit transistor configuration as recited by claim 14 wherein said first, second and third CMOS transistors are each n-channel CMOS transistors.

16. The CMOS integrated circuit transistor configuration as recited by claim 14 wherein said first, second and third CMOS transistors are each p-channel CMOS transistors.

17. The CMOS integrated circuit transistor configuration as recited by claim 6 and further including:

a. a fifth CMOS transistor being an n-channel CMOS transistor and having source, drain and gate terminals, the gate terminal of said fifth CMOS transistor being coupled to said first shielding voltage conductor, the source terminal of said fifth CMOS transistor being coupled to the drain terminal of said second CMOS transistor, and the drain terminal of said fifth CMOS transistor being coupled to said output terminal; and b. a sixth CMOS transistor being a p-channel CMOS transistor and having source, drain and gate terminals, the gate terminal of said sixth CMOS transistor being coupled to said first shielding voltage conductor, the source terminal of said sixth CMOS transistor being coupled to the drain terminal of said fourth CMOS transistor, and the drain terminal of said sixth CMOS transistor being coupled to said output terminal.

18. The CMOS integrated circuit transistor configuration as recited by claim 7 and further including:

a. a fifth CMOS transistor being an n-channel CMOS transistor and having source, drain and gate terminals, the gate terminal of said fifth CMOS transistor being coupled to said first shielding voltage conductor, the source terminal of said fifth CMOS transistor being coupled to the drain terminal of said second CMOS transistor, and the drain terminal of said fifth CMOS transistor being coupled to said output terminal; and b. a sixth CMOS transistor being a p-channel CMOS transistor and having source, drain and gate terminals, the gate terminal of said sixth CMOS transistor being coupled to said second shielding voltage conductor, the source terminal of said sixth CMOS transistor being coupled to the drain terminal of said fourth CMOS transistor, and the drain terminal of said sixth CMOS transistor being coupled to said output terminal.

19. The CMOS integrated circuit transistor configuration as recited by claim 1 wherein said first CMOS transistor includes source and drain regions formed within a first well of semiconductor material, said source and drain regions being electrically coupled to said source and drain terminals, respectively, of said first CMOS transistor, and said first well of semiconductor material being electrically coupled to the source terminal of said first CMOS transistor.

20. The CMOS integrated circuit transistor configuration as recited by claim 14 wherein:

a. said first CMOS transistor includes source and drain regions formed within a first well of semiconductor material, said source and drain regions being electrically coupled to said source and drain terminals, respectively, of said first CMOS transistor, and said first well of semiconductor material is electrically coupled to the source terminal of said first CMOS transistor; and b. said third CMOS transistor includes source and drain regions formed within a third well of semiconductor material, said source and drain regions being electrically coupled to said source and drain terminals, respectively, of said third CMOS transistor, and said third well of semiconductor material is electrically coupled to the source terminal of said third CMOS transistor.

21. A CMOS integrated circuit transmission gate for allowing operation at relatively higher power supply voltages, comprising in combination:

a. first and second power supply conductors adapted to receive first and second power supply voltages;

b. a first shielding voltage conductor adapted to receive a first shielding voltage, the first shielding voltage having a magnitude bounded between the first and second power supply voltages;

c. an input terminal for receiving an input signal;

d. an output terminal for providing an output signal substantially corresponding to said input signal;

e. a first control terminal for receiving a first control signal for selectively indicating that the input signal should be transmitted to said output terminal;

f. a first CMOS transistor having source, drain and gate terminals, the drain terminal of said first CMOS transistor being coupled to said first control terminal for receiving the first control signal, and the gate terminal of said first CMOS transistor being coupled to said first shielding voltage conductor;

g. a second CMOS transistor having source, drain and gate terminals, the gate terminal of said second CMOS transistor being coupled to the source terminal of said first CMOS transistor for receiving therefrom the first control signal to selectively enable or disable said second CMOS transistor;

h. a third CMOS transistor having source, drain and gate terminals, the gate terminal of said third CMOS transistor being coupled to said first shielding voltage conductor, the source terminal of said third CMOS transistor being coupled to the drain terminal of said second CMOS transistor, and the drain terminal of said third CMOS transistor being coupled to said output terminal for coupling the output signal thereto; and i. a fourth CMOS transistor having source, drain and gate terminals, the gate terminal of said fourth CMOS transistor being coupled to said first shielding voltage conductor, the drain terminal of said fourth CMOS transistor being coupled to said input terminal for receiving the input signal, and the source terminal of said fourth CMOS transistor being coupled to the source terminal of said second CMOS transistor for transmitting the input signal thereto.

22. The CMOS integrated circuit transmission gate as recited by claim 21 wherein said first, second, third, and fourth CMOS transistors are each n-channel CMOS transistors.

23. The CMOS integrated circuit transmission gate as recited by claim 21 wherein said first, second, third, and fourth CMOS transistors are each p-channel CMOS transistors.

24. The CMOS integrated circuit transmission gate as recited by claim 22 further including:

a. a second control terminal for receiving a second control signal for selectively indicating that the input signal should be transmitted to said output terminal;

b. a fifth CMOS transistor being a p-channel CMOS transistor and having source, drain and gate terminals, the drain terminal of said fifth CMOS transistor being coupled to said second control terminal for receiving the second control signal, and the gate terminal of said fifth CMOS transistor being coupled to said first shielding voltage conductor;

c. a sixth CMOS transistor being a p-channel CMOS transistor and having source, drain and gate terminals, the gate terminal of said sixth CMOS transistor being coupled to the source terminal of said fifth CMOS transistor for receiving therefrom the second control signal to selectively enable or disable said sixth CMOS transistor;

d. a seventh CMOS transistor being a p-channel CMOS transistor and having source, drain and gate terminals, the gate terminal of said seventh CMOS transistor being coupled to said first shielding voltage conductor, the source terminal of said seventh CMOS transistor being coupled to the drain terminal of said sixth CMOS transistor, and the drain terminal of said seventh CMOS transistor being coupled to said output terminal for coupling the output signal thereto; and e. an eighth CMOS transistor being a p-channel CMOS transistor and having source, drain and gate terminals, the gate terminal of said eighth CMOS transistor being coupled to said first shielding voltage conductor, the drain terminal of said eighth CMOS transistor being coupled to said input terminal for receiving the input signal, and the source terminal of said eighth CMOS transistor being coupled to the source terminal of said sixth CMOS transistor for transmitting the input signal thereto.

25. The CMOS integrated circuit transmission gate as recited by claim 22 further including:

a. a second control terminal for receiving a second control signal for selectively indicating that the input signal should be transmitted to said output terminal;

b. a second shielding voltage conductor adapted to receive a second shielding voltage, the second shielding voltage having a magnitude bounded between the first and second power supply voltages;

c. a fifth CMOS transistor being a p-channel CMOS transistor and having source, drain and gate terminals, the drain terminal of said fifth CMOS transistor being coupled to said second control terminal for receiving the second control signal, and the gate terminal of said fifth CMOS transistor being coupled to said second shielding voltage conductor;

d. a sixth CMOS transistor being a p-channel CMOS transistor and having source, drain and gate terminals, the gate terminal of said sixth CMOS transistor being coupled to the source terminal of said fifth CMOS transistor for receiving therefrom the second control signal to selectively enable or disable said sixth CMOS transistor;

e. a seventh CMOS transistor being a p-channel CMOS transistor and having source, drain and gate terminals, the gate terminal of said seventh CMOS transistor being coupled to said second shielding voltage conductor, the source terminal of said seventh CMOS transistor being coupled to the drain terminal of said sixth CMOS transistor, and the drain terminal of said seventh CMOS transistor being coupled to said output terminal for coupling the output signal thereto; and f. an eighth CMOS transistor being a p-channel CMOS transistor and having source, drain and gate terminals, the gate terminal of said eighth CMOS transistor being coupled to said second shielding voltage conductor, the drain terminal of said eighth CMOS transistor being coupled to said input terminal for receiving the input signal, and the source terminal of said eighth CMOS transistor being coupled to the source terminal of said sixth CMOS transistor for transmitting the input signal thereto.

* * * * *